(12) United States Patent
Chen et al.

(10) Patent No.: US 10,290,653 B2
(45) Date of Patent: May 14, 2019

(54) INTEGRATED CIRCUIT LAYOUT STRUCTURE

(71) Applicant: UNITED MICROELECTRONICS CORP., Hsin-Chu (TW)

(72) Inventors: Chien-Hung Chen, Taipei (TW); Chun-Hsien Wu, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/466,871

(22) Filed: Mar. 23, 2017

(65) Prior Publication Data

US 2017/0194349 A1    Jul. 6, 2017

Related U.S. Application Data

(62) Division of application No. 14/526,536, filed on Oct. 29, 2014, now abandoned.

(30) Foreign Application Priority Data

Sep. 23, 2014 (TW) .............................. 103132848 A

(51) Int. Cl.
*H01L 27/118* (2006.01)
*H01L 27/02* (2006.01)
*H01L 27/092* (2006.01)

(52) U.S. Cl.
CPC .... *H01L 27/11807* (2013.01); *H01L 27/0207* (2013.01); *H01L 27/092* (2013.01); *H01L 2027/11885* (2013.01)

(58) Field of Classification Search
CPC ............... H01L 27/0207; H01L 27/092; H01L 27/0928; H01L 27/11807; H01L 27/11885

USPC .......................... 257/206–207, 211, 369, 499
See application file for complete search history.

(56) References Cited

U.S. PATENT DOCUMENTS

| | | | |
|---|---|---|---|
| 6,329,845 B1 * | 12/2001 | Taki | ..................... H01L 27/0207 257/E27.062 |
| 6,838,713 B1 * | 1/2005 | Gheewala | ......... H01L 27/11807 257/211 |
| 6,849,906 B2 | 2/2005 | Maeno et al. | |
| 6,938,226 B2 | 8/2005 | Nguyen et al. | |
| 7,325,214 B2 | 1/2008 | Liao | |
| 7,966,596 B2 | 6/2011 | Lu et al. | |

(Continued)

OTHER PUBLICATIONS

Peter Uyemura,"Introduction to Circuits", Fourth Edition, 2004, John Wiley & Sons, pp. 339~349 & 352~360 & 362~364.

*Primary Examiner* — Marc Anthony Armand
*Assistant Examiner* — Sue Tang
(74) *Attorney, Agent, or Firm* — Winston Hsu

(57) ABSTRACT

An integrated circuit layout structure having dual-height standard cells includes at least a first standard cell including a first cell height and at least a second standard cell including a second cell height. The second cell height is one half of the first cell height. The first standard cell includes one first doped region formed in a middle of the first standard cell and a plurality of second doped regions formed at a top side and a bottom side of the first standard cell. The first doped region includes a first conductivity type and the second doped regions include a second conductivity type complementary to the first conductivity type. And an area of the first doped region is smaller than an area of the total second doped regions.

17 Claims, 12 Drawing Sheets

(56) References Cited

U.S. PATENT DOCUMENTS

| | | |
|---|---|---|
| 8,631,377 B2 | 1/2014 | Lee et al. |
| 8,698,205 B2 | 4/2014 | Tzeng et al. |
| 2004/0014272 A1* | 1/2004 | Shibutani .......... H01L 27/11807 |
| | | 438/206 |
| 2010/0289111 A1* | 11/2010 | Lee .................... G06F 17/5072 |
| | | 257/499 |
| 2011/0049575 A1* | 3/2011 | Tanaka .............. H01L 27/11807 |
| | | 257/206 |
| 2014/0217513 A1 | 8/2014 | Hayashi |

\* cited by examiner

INTEGRATED CIRCUIT LAYOUT STRUCTURE

CROSS REFERENCE TO RELATED APPLICATIONS

This application is a division of U.S. Application Publication No. 2016/0086932 filed Oct. 29, 2014, and incorporated herein by reference in its entirety.

BACKGROUND OF THE INVENTION

1. Field of the Invention

The invention relates to an integrated circuit layout structure, and more particularly, to an integrated circuit layout structure with standard cells differing in cell height.

2. Description of the Prior Art

Semiconductor integrated circuits are one of the most important hardware bases in the modern information society. A key design point of the semiconductor industry is to increase integration of integrated circuits, and therefore to use the area of integrated circuits more efficiently.

Generally speaking, integrated circuits having complex functions are made up of many standard cells, each with basic functions. For example, standard cells of different kinds of logic gates, such as AND gates, OR gates, NOR gates, inverters, cells of flip-flops, adders and counters, are always used to realize complex integrated circuits. When designing an integrated circuit having specific functions, standard cells are selected. Next, designers draw out design layouts of the integrated circuit including the selected standard cells and real semiconductor integrated circuits are then manufactured according to the design layouts. For the convenience of integrated circuit design, a library including frequently used standard cells and their corresponding layouts are established by the designers. Therefore when designing an integrated circuit, a designer selects desired standard cells from the library of and places them in an automatic placement and routing (hereinafter abbreviated as APR) block. The standard cells may then be further interconnected with other elements in a variety of ways to perform desired functions. By selecting the cells from a library and placing them into APR blocks, a designer can quickly design complex functions without having to worry about the details of each individual transistor. And by realizing different layouts on different semiconductor/conductive/insulating layers and constructing electrical connections between those layers, the whole integrated circuits are formed.

Furthermore, for complying with requirements to different driving capabilities, standard cells are made of different cell heights. "Cell height" of a standard cell is referred to the number of tracks between the uppermost and lowermost points of the standard cell, and "track" is typically referred to one contact pitch. For example, a six-track standard cell means that a transistor channel width in the cell is six contact pitches wide. It is well-known to those skilled in the art that a standard cell with higher driving capability requires larger channel width. In other words, a standard cell with higher driving capability requires larger cell height. On the contrary, a standard cell with lower driving capability requires smaller channel with, that is, smaller cell height. When arranging and placing those standard cells of different cell heights into one APR block, not only the driving capabilities are in the designer's consideration, but also the requirements of electrical leakage and power consumption. Sometimes standard cells of different cell heights are all placed in one APR block, and thus such APR block includes cells of multi-heights. Or, standard cells are categorized and placed in different APR blocks according to their cell heights, and thus those APR blocks respectively include cells of single-height.

It is found that valuable areas in the APR block with cells of multi-heights are always wasted and complexities of circuit design and manufacturing processes are both increased. However, it is also found that in the APR blocks with cells of single-height, the high-speed APR and low power consumption APR are individually formed and extra connections are required. Undesirably, "integration" is not achieved by such arrangement. More severely, design for manufacturing (DFM) issue is generated by such arrangement.

Therefore, an integrated circuit layout structure that is able to comply with requirements of high-speed, low power consumption and superior space utilization efficiency is still in need.

SUMMARY OF THE INVENTION

According to the claimed invention, an integrated circuit layout structure having dual-height standard cells is provided. The integrated circuit layout structure having the dual-height standard cells includes at least a first standard cell and at least a second standard cell. The first standard cell includes a first cell height, the second standard cell includes a second cell height, and the second cell height is one half of the first cell height. The first standard cell includes at least one or more first doped region formed in a middle of the first standard cell and a plurality of second doped regions formed at a top side and a bottom side of the first standard cell. The first doped region includes a first conductivity type, the second doped regions include a second conductivity type, and the first conductivity type and the second conductivity type are complementary to each other.

According to the claimed invention, another integrated circuit layout structure having dual-height standard cells is provided. The integrated circuit layout structure having dual-height standard cell includes at least a first standard cell, at least a second standard cell, and a first conductor extending across a middle of the first standard cell. The first standard cell includes a first cell height, the second standard cell includes a second cell height, and the second cell height is one half of the first cell height. The first standard cell includes a plurality of first doped regions and at least one or more second doped region. The first doped regions include a first conductivity type, the second doped region includes a second conductivity type, and the first conductivity type and the second conductivity type are complementary to each other. Furthermore, the first doped regions are separately formed and spaced apart from each other at two sides of the first conductor.

According to the integrated circuit layout structure having the dual-height standard cells provided by the present invention, the second cell height of the second standard cell is one half of the first cell height of the first standard cell and thus the integrated circuit layout structure is taken as to be constructed by standard cells of 1× cell height and another standard cells of 2× cell height. Accordingly, both the integrated circuit layout design and manufacturing processes are simplified and the space utilization efficiency is improved because there are only two kinds of standard cells. More important, the integrated circuit layout structure having the dual-height standard cells complies with different requirements: The standard cells of 2× cell height serve as high-speed devices with high driving capability while the standard cells of 1× cell height comply with the requirements of low leakage and low power consumption. Eventually, the integrated circuit layout structure having the dual-height standard cells provided by the present invention is able to comply with the integration requirements of high speed and low power consumption.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 and 5 are schematic drawings illustrating an integrated circuit layout structure provided by a second preferred embodiment of the present invention.

FIGS. 1 and 7 are schematic drawings illustrating an integrated circuit layout structure provided by a third preferred embodiment.

FIGS. 1 and 10-11 are schematic drawings illustrating the integrated circuit layout structure provided by the fourth preferred embodiment.

DETAILED DESCRIPTION

Figure 1:
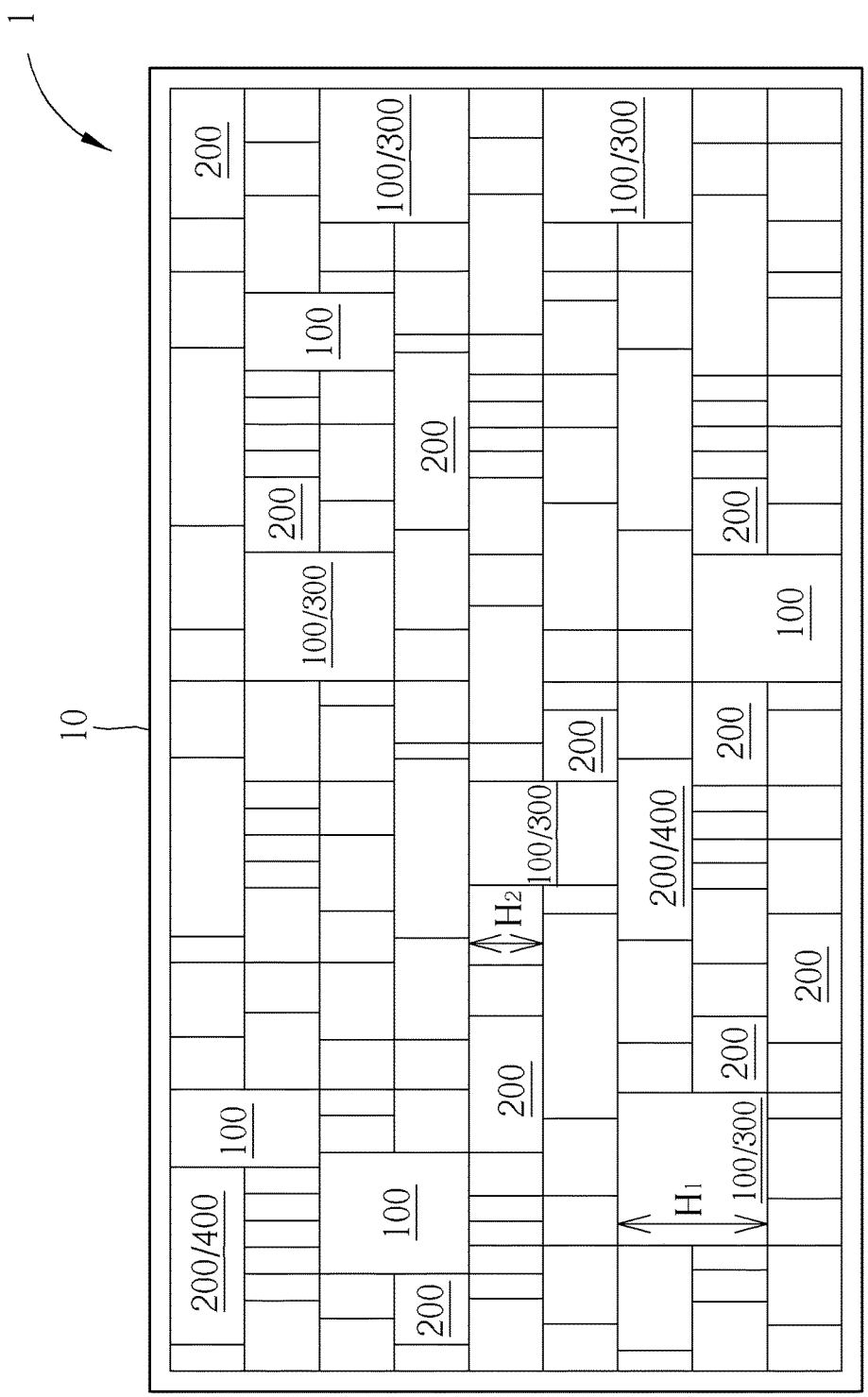
FIGS. 1-4 are schematic drawings illustrating an integrated circuit layout structure provided by a first preferred embodiment of the present invention.

Please refer to FIGS. 1-4, which are schematic drawings illustrating an integrated circuit layout structure provided by a first preferred embodiment of the present invention. Please refer to FIG. 1. An integrated circuit layout structure 1 provided by the preferred embodiment includes at least an APR block 10, and the APR block 10 includes a plurality of first standard cells 100 and a plurality of second standard cells 200. More important, the first standard cells 100 and the second standard cells 200 include different cell heights. Therefore, as shown in FIG. 1, the integrated circuit layout structure 1 provided by the preferred embodiment is constructed by the dual-height standard cells 100/200. It should be noted that since the integrated circuit layout structure is usually formed by different standard cells such as, for example but not limited to, inverter (INV), 2-input AND gate (AND2), 2-input NOR gate (hereinafter abbreviated as NOR2), 4-input OR-AND inverter (OAI4), and D flip-flop (DFF), an NOR2 is used as an exemplar in accordance with the preferred embodiment. However, those skilled in the art would easily realize that it is not limited to this.

Figure 2:
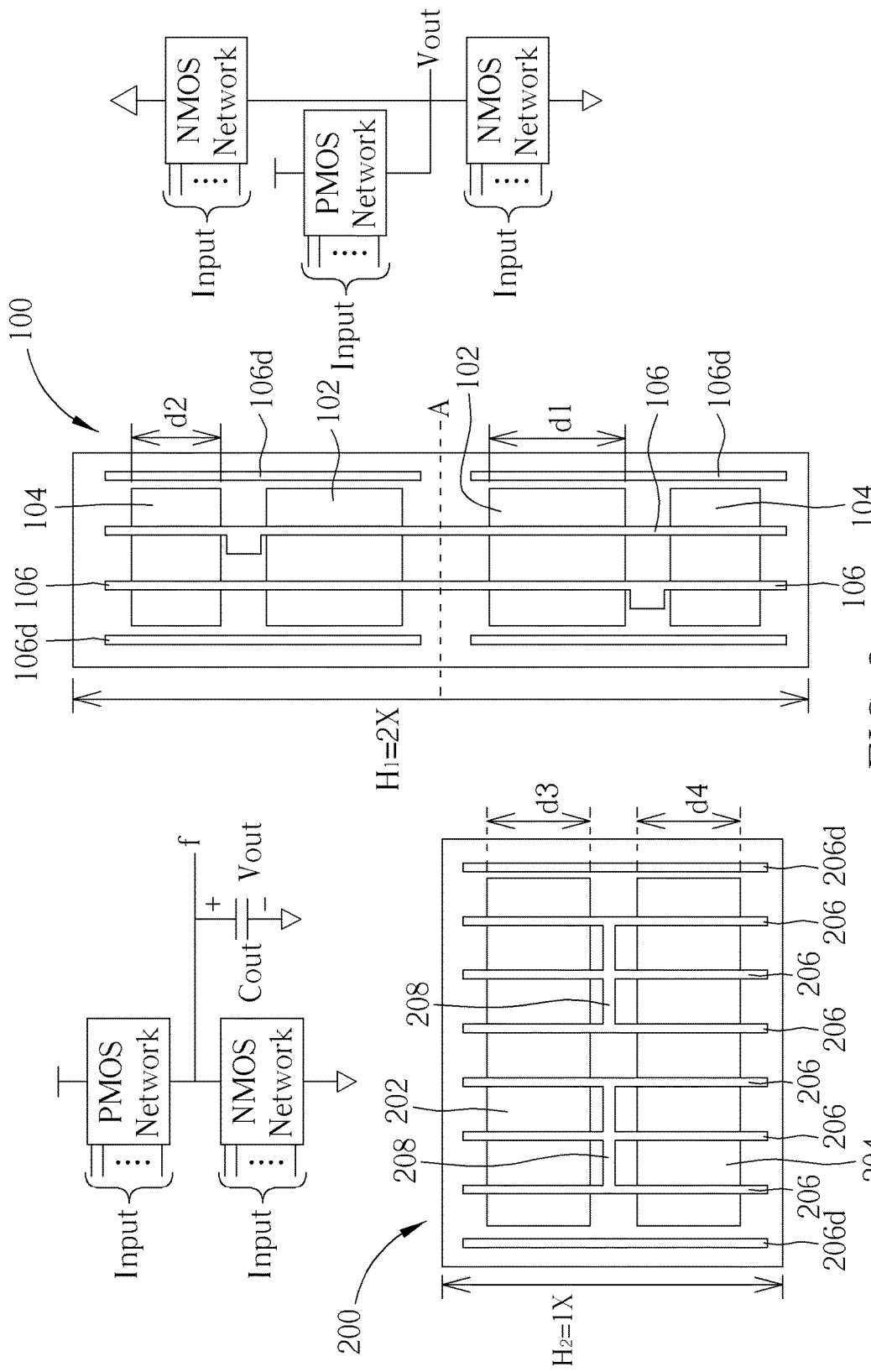
Figure 3:
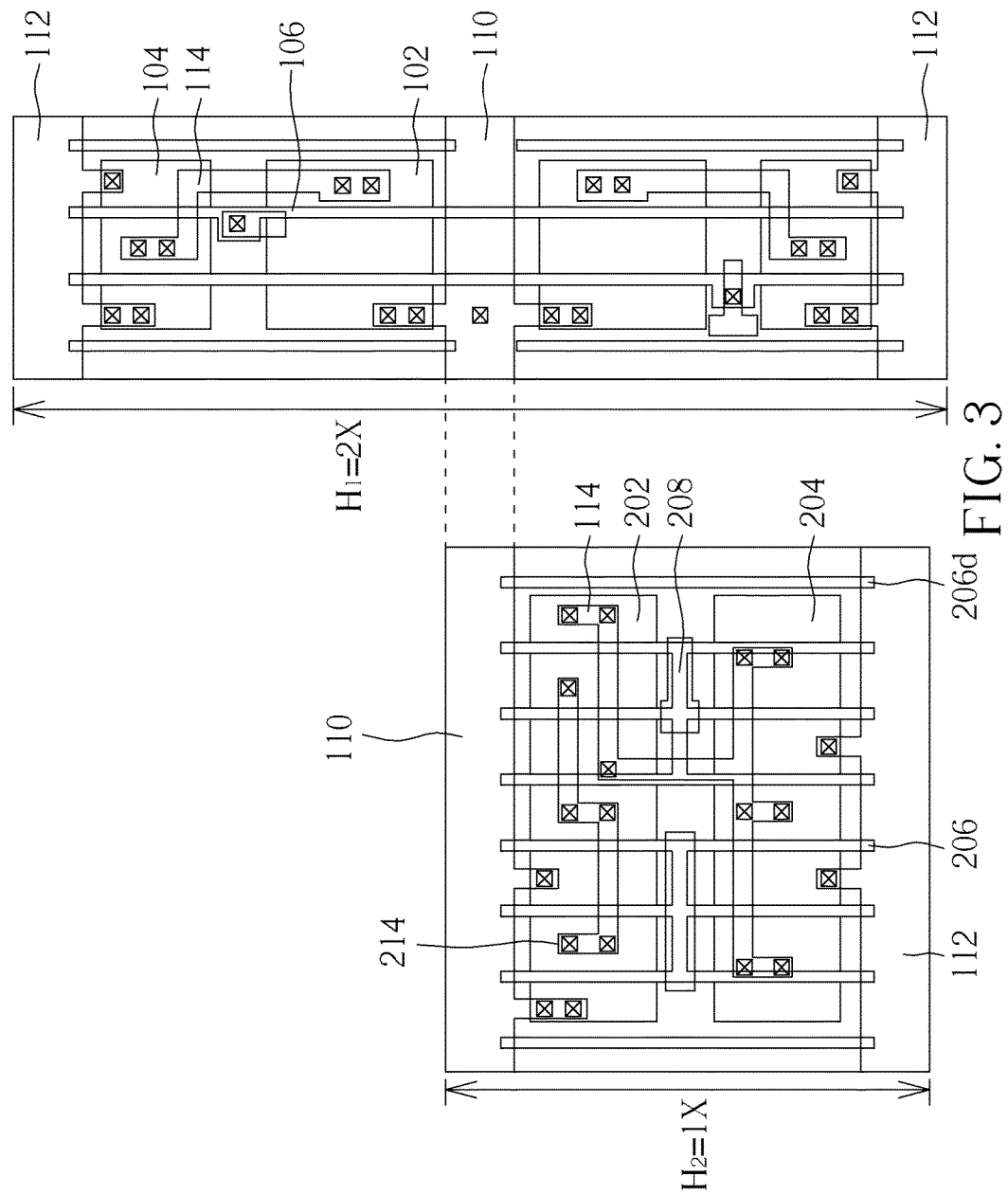

Please refer to FIGS. 2-3. The first standard cells 100 and the second standard cells 200 provided by the preferred embodiment can both be NOR2 cells, but not limited to this. The first standard cells 100 respectively include a first cell height H1, the second standard cells 200 respectively include a second cell height H2, and the second cell height H2 is one half of the first cell height H1. For example, when the first standard cell 100 occupies 12 tracks, the second standard cell 200 occupies only 6 tracks. In another exemplar, when the first standard cell 100 occupies 14 tracks, the second standard cell 200 occupies only 7 tracks. However those skilled in the art should easily realize that the tracks occupied by the abovementioned first standard cells 100 and second standard cells 200 are only examples, and it is not limited to this. In other words, the second cell height H2 of the second standard cells 200 is taken as a 1× height while the first cell height H1 of the first standard cells 100 is taken as a 2× height. Because different driving capabilities and speeds are required to even one kind of standard cells, 2× height standard cells for high driving capability and high speed are designed by the electronic design automation (hereinafter abbreviated as EDA) while 1× height standard cells for lower leakage and low power consumption are designed by the EDA, and thus the first standard cells 100 (2× height) and the second standard cells 200 (1× height) are obtained. By arranging and placing the first standard cells 100 and the second standard cells 200 into the APR blocks 10, the APR blocks 10 of the integrated circuit layout structure 1 having dual-height cells are formed.

Please refer to FIG. 2. It is well-known to those skilled in the art that each standard cell layout may include active region layout such as layout for wells or for doped regions, and polysilicon or semiconductor layouts. The active region layout and the polysilicon layout construct transistors. Specifically speaking, the active region layout can include sources and drains, the polysilicon design layout can include gates, and the gates, the sources and the drains construct metal-oxide-semiconductor (hereinafter abbreviated as MOS) transistors. In the preferred embodiment, the first standard cell 100 includes a plurality of first doped regions 102 and a plurality of second doped regions 104. The first doped regions 102 include a first conductivity type, the second doped regions 104 include a second conductivity type, and the first conductivity type and the second conductivity type are complementary to each other. The second standard cell 200 includes a plurality of third doped regions 202 and a plurality of fourth doped regions 204, the third doped regions 202 include the first conductivity type and the fourth doped regions 204 include the second conductivity type. In the preferred embodiment, the first conductivity type is a p type and the second conductivity type is an n type. However those skilled in the art should easily realize that it can be vice versa. As shown in FIG. 2, the first doped regions 102 are physically spaced apart from each other and arranged in a middle of the first standard cell 100. The second doped regions 104 are physically spaced apart from each other and arranged at a top side and a bottom side of the first standard cell 100. And the first doped regions 102 and the second doped regions 104 are physically spaced apart from each other. More important, the first doped regions 102 and the second doped regions 104 are mirror symmetric with respect to a symmetry axis A. And the first doped regions 102 at two sides of the symmetry axis A are physically spaced apart from each other. In the second standard cell 200, the third doped regions 202 are physically spaced apart from each other and arranged at a top side or a bottom side of the second standard cell 200 while the fourth doped regions 204 are physically spaced apart from each other and arranged at the alternatively side. The third doped regions 202 and fourth doped regions 204 are also spaced apart from each other. Furthermore, the first doped regions 102 and the third doped regions 202 include the same conductivity type (the p type), however a length d1 of the first doped regions 102 is larger than a length d3 of the third doped regions 202 in the preferred embodiment. The second doped regions 104 and the fourth doped regions 204 include the same conductivity type (the n type), and a length d2 of the second doped regions 104 is equal to a length d4 of the fourth doped regions 204, but not limited to this.

Please still refer to FIG. 2. In the preferred embodiment, the first standard cell 100 further includes a plurality of first gate electrodes 106 and the second standard cell 200 further includes a plurality of second gate electrodes 206. Additionally, the first standard cell 100 can optionally include a plurality of dummy gates 106d and the second standard cell 200 can optionally include a plurality of dummy gates 206d. The dummy gates 106d and 206d are provided to improve uniformity of polysilicon, and thus the following fabricating processes are improved. Furthermore, the second standard cell 200 can further include a plurality of gate connectors 208 formed in between the second gate electrodes 206 for electrically connecting the second gate electrodes 206. It is noteworthy that the second gate electrodes 206 and the second gate connectors 208 include a same material such as, for example but not limited to, polysilicon, and the second gate electrodes 206 and the second gate connectors 208 are formed in a same layer. In the preferred embodiment, the first standard cell 100 includes no gate connectors, but not limited to this.

According to the preferred embodiment, PMOS transistors are formed by the first gate electrodes 106 and the first doped regions 102 formed at its two sides, and NMOS transistors are formed by the first gate electrodes 106 and the second doped regions 104 at its two sides. In the same concept, PMOS transistors are formed by the second gate electrodes 206 and the third doped regions 202 at its two sides, and NMOS transistors are formed by the second gate electrodes 206 and the fourth doped regions 204 at its two sides. Since the length d1 of the first doped regions 102 is larger than the length d3 of the third doped regions 202, the PMOS transistors in the first standard cells 100, which are formed by the first doped regions 102 and the first gate electrodes 106, obtain driving capability and speed higher than the PMOS transistors in the second standard cells 200.

Please refer to FIG. 3. It is also well-known to those skilled in the art that the standard cell design layout includes not only the active region design layout and the polysilicon design layout, but also first metal layer layout, second metal layer layout and contact/via layouts, etc. The metal layer layouts are provided to connect the transistors while the contact/via layouts are provided to connect layouts in different layers. Furthermore, some contact/via layouts, on the other hands, are formed to be signal input/output terminals for the cells. Such contact/via layout serves as signal layout. By stacking the active region layouts, polysilicon layouts, metal layer layouts and contact/via layouts in different layers, 3-dimensional standard cells are formed. Accordingly, the preferred embodiment further provides at least a first conductor 110, a pair of second conductors 112, and a plurality of connecting layers 114. As shown in FIG. 3, where the electrical connection is required in the first standard cell 100, the connecting layer 114 is formed. In the same concept, where the electrical connection is required in the second standard cell 200, the connecting layer 114 is also formed. As shown in FIG. 3, the first conductor 110 extends across the middle of the first standard cell 100, and the first doped regions 102 are formed at respective two sides and spaced apart by the first conductor 110. In other words, the first doped regions 102 formed at the two sides of the first conductor 110 do not contact each other. Additionally, no first doped region 102 is formed underneath or overlapped with the first conductor 110 in the preferred embodiment.

Figure 4:
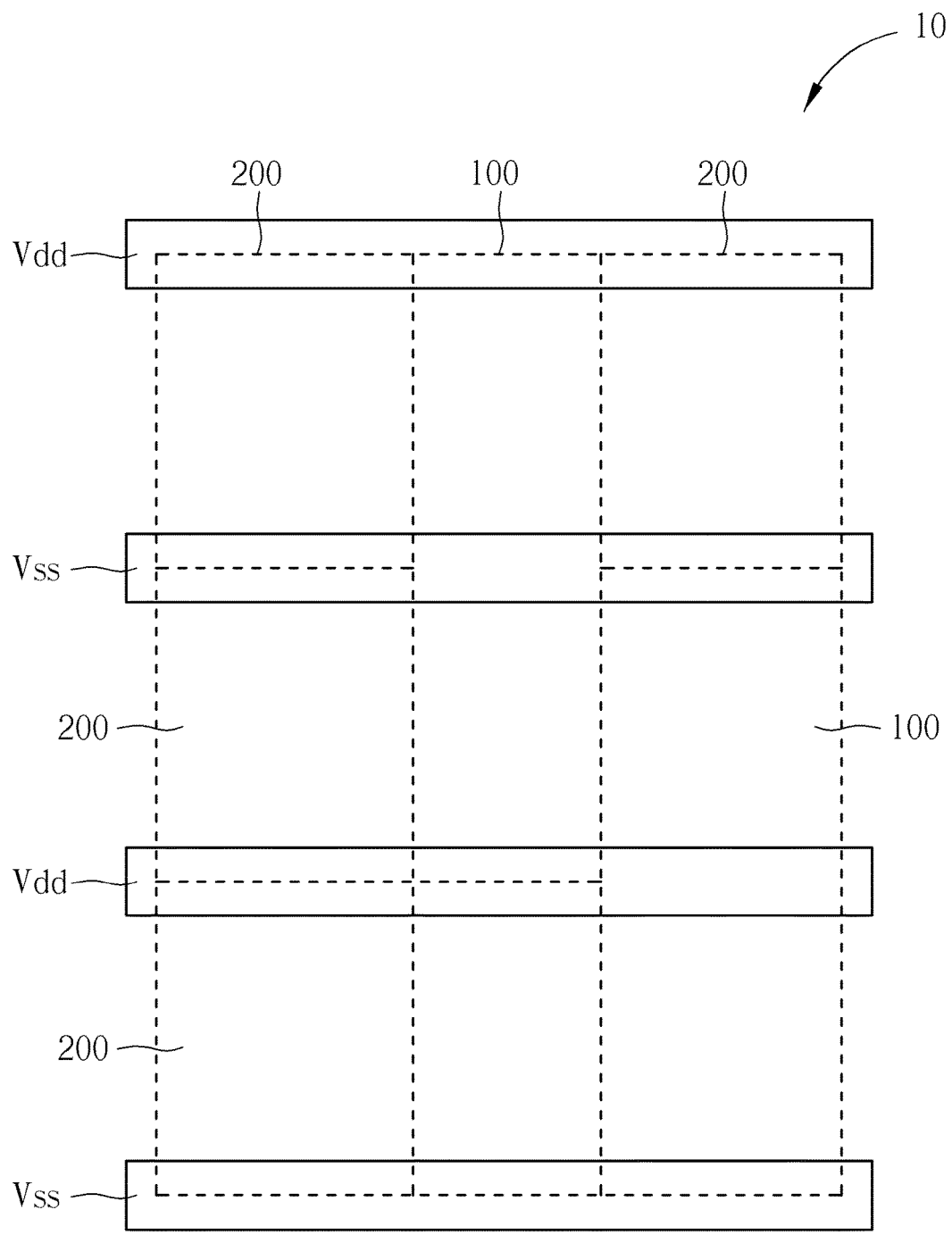

Please refer to FIG. 4. For clarifying the spatial relationships between the first conductors 110, the second conductors 112, the first standard cells 100, and the second standard cells 200, internal elements in the first standard cells 100 and the second standard cells 200 are all omitted. As person skilled in the art is familiar with, each standard cell must be connected to appropriate DC power to obtain power supply voltage Vdd. Also, each standard cell must obtain a ground voltage Vss. Therefore, Vdd power strips and Vss power strips must be alternately arranged in one APR block 10 as shown in FIG. 4, so that the standard cells arranged in the APR block 10 can obtain Vdd and Vss. In the preferred embodiment, the first conductors 110 can be the Vdd strip and thus the second conductors 112 are the Vss strip in that case. On the contrary, when the first conductors 110 are the Vss strips, the second conductors 112 are the Vdd strips. In each first standard cell 100, as shown in FIG. 4, the first conductors 110 extend across the middles of the first standard cells 100 and the second conductors 112s extend across tops and bottoms of the first standard cells 100. In the preferred embodiment, the first conductors 110 are the Vdd strips and the second conductors 112 are the Vss strips. However those skilled in the art should easily realize that it can be vice versa in a modification to the preferred embodiment. In each second standard cell 200, as shown in FIG. 4, one of the second conductors 112 extends across a top or a bottom of the second standard cell 200, and the first conductor 110 extends across the top or the bottom of the second standard cell 200 opposite to the second conductor 112. Accordingly, not only the integration of 1× height standard cells and 2× height standard cells are simplified, but also the power supply layout designing is simplified according to the integrated circuit layout structure 1 provided by the preferred embodiment. And thus design complexity and process complexity are both reduced.

According to the integrated circuit layout structure 1 provided by the present invention, design complexity and process complexity are both reduced, and space utilization is thus improved because the integrated circuit layout structure 1 includes the standard cells 100 of 2× height and the standard cells 200 of 1× height, only. Secondly, in the integrated circuit layout structure 1 provided by the present invention, the first standard cells 100 of 2× cell height serve as high-speed devices with high driving capability while the second standard cells 200 of 1× cell height comply with the requirements of low leakage and low power consumption. Eventually, the integrated circuit layout structure 1 provided by the present invention is able to concurrently comply with the integration requirements of high speed and low power consumption.

Figure 5:
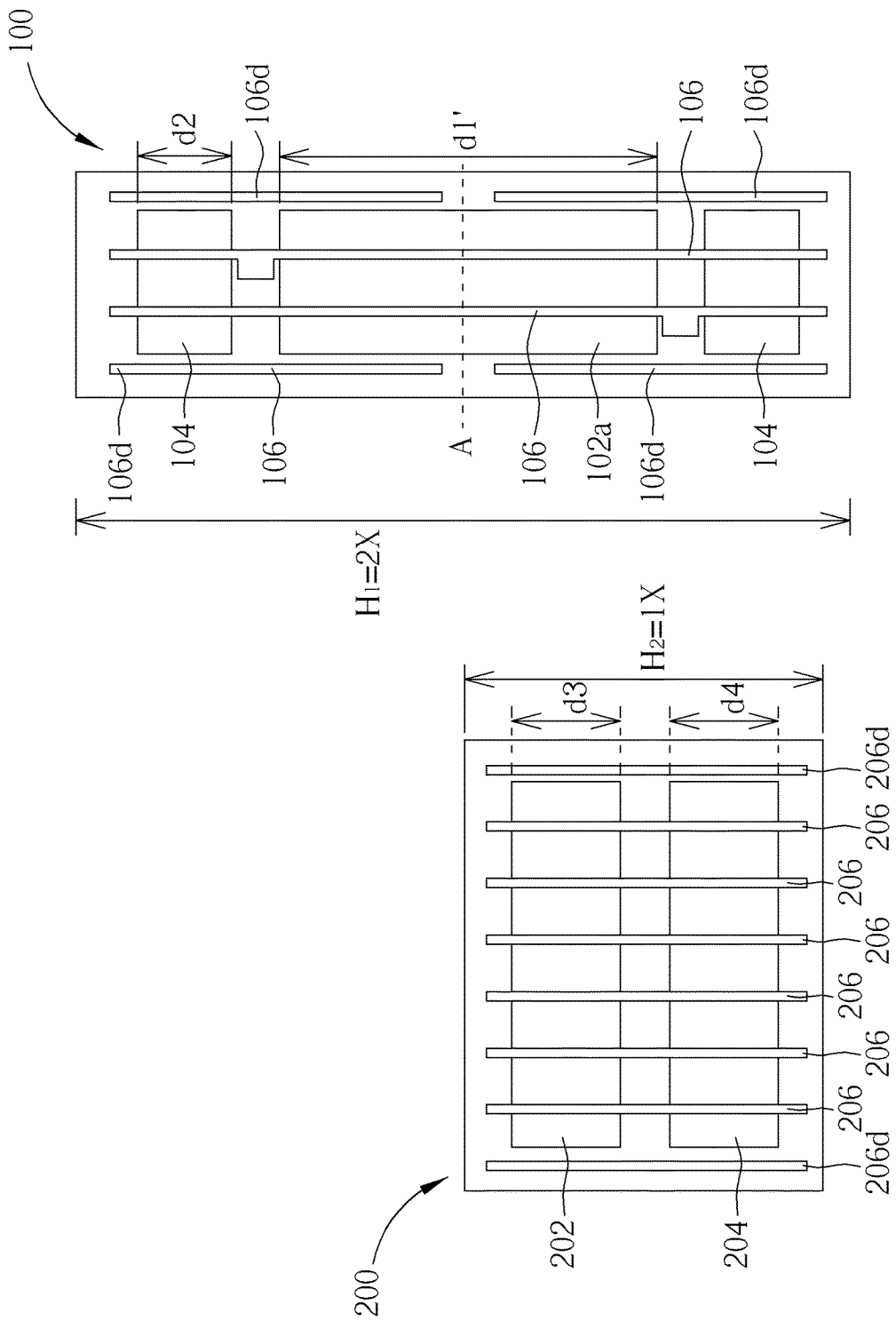
Figure 6:
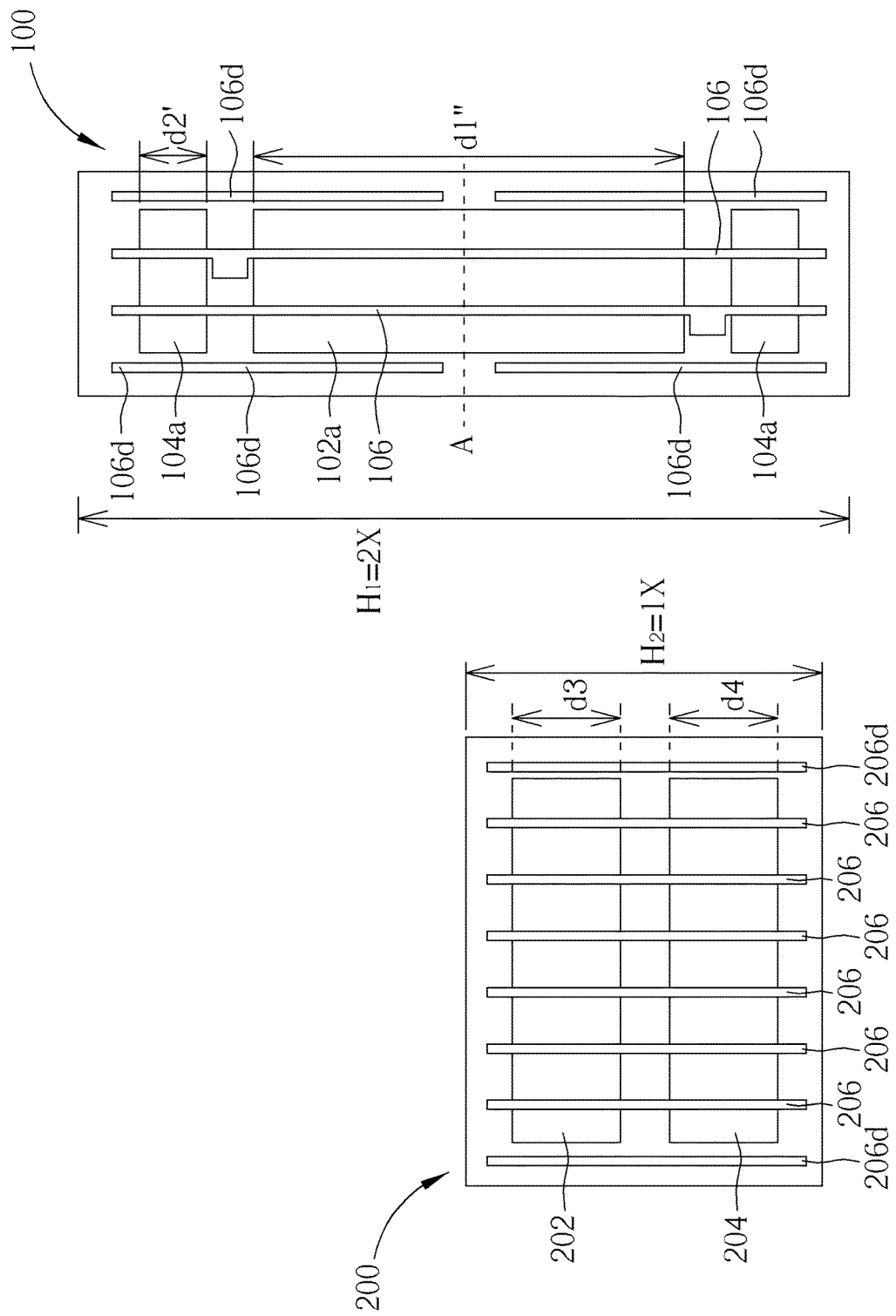
FIG. 6 is a schematic drawing illustrating a modification to the second preferred embodiment.

Please refer to FIGS. 1, 5 and 6. FIGS. 1 and 5 are schematic drawings illustrating an integrated circuit layout structure provided by a second preferred embodiment of the present invention and FIG. 6 is a schematic drawing illustrating a modification to the second preferred embodiment. It should be noted that elements the same in the first and second preferred embodiments are designated by the same numerals.

Please refer to FIG. 5 together with FIG. 1. An integrated circuit layout structure 1 provided by the preferred embodiment includes at least an APR block 10, and the APR block 10 includes a plurality of first standard cells 100 and a plurality of second standard cells 200. More important, the first standard cells 100 and the second standard cells 200 include different cell heights. Therefore, the integrated circuit layout structure 1 provided by the preferred embodiment is constructed by the dual-height standard cells 100/200. The first standard cells 100 and the second standard cells 200 can both be the NOR2 cells in the preferred embodiment, but not limited to this. The first standard cells 100 respectively include a first cell height H1, the second standard cells 200 respectively include a second cell height H2, and the second cell height H2 is one half of the first cell height H1. In other words, the second cell height H2 of the second standard cells 200 is taken as a 1× height while the first cell height H1 of the first standard cells 100 is taken as a 2× height. Because different driving capabilities and speeds are required to even one kind of standard cells, 2× height standard cells for high driving capability and high speed are designed by the EDA while 1× height standard cells for lower leakage and low power consumption are designed by the EDA, and thus the first standard cells 100 of 2× height and the second standard cells 200 of 1× height are obtained. By arranging and placing the first standard cells 100 and the second standard cells 200 into the APR blocks 10, the APR blocks 10 of the integrated circuit layout structure 1 having dual-height cells are formed.

Pleas still refer to FIG. 5. The first standard cell 100 includes a plurality of first doped regions 102a and a plurality of second doped regions 104. The first doped regions 102a include a first conductivity type, the second doped regions 104 include a second conductivity type, and the first conductivity type and the second conductivity type are complementary to each other. The second standard cell 200 includes a plurality of third doped regions 202 and a plurality of fourth doped regions 204, the third doped regions 202 include the first conductivity type and the fourth doped regions 204 include the second conductivity type. In the preferred embodiment, the first conductivity type is a p type and the second conductivity type is an n type. However those skilled in the art should easily realize that it can be vice versa. As shown in FIG. 5, the first doped regions 102a are physically spaced apart from each other and arranged in a middle of the first standard cell 100. The second doped regions 104 are physically spaced apart from each other and arranged at a top side and a bottom side of the first standard cell 100. And the first doped regions 102a and the second doped regions 104 are physically spaced apart from each other. More important, the first doped regions 102a and the second doped regions 104 are mirror symmetric with respect to a symmetry axis A. In the second standard cell 200, the third doped regions 202 are physically spaced apart from each other and arranged at a top side or a bottom side of the second standard cell 200 while the fourth doped regions 204 are physically spaced apart from each other and arranged at the alternatively side. The third doped regions 202 and fourth doped regions 204 are also spaced apart from each other. Furthermore, the first doped regions 102a and the third doped regions 202 include the same conductivity type (the p type), however a length d1' of the first doped regions 102a is larger than a length d3 of the third doped regions 202 in the preferred embodiment. The second doped regions 104 and the fourth doped regions 204 include the same conductivity type (the n type), and a length d2 of the second doped regions 104 is equal to a length d4 of the fourth doped regions 204, but not limited to this.

Please still refer to FIG. 5. In the preferred embodiment, the first standard cell 100 further includes a plurality of first gate electrodes 106 and the second standard cell 200 further includes a plurality of second gate electrodes 206. Additionally, the first standard cell 100 can optionally include a plurality of dummy gates 106d and the second standard cell 200 can optionally include a plurality of dummy gates 206d. The dummy gates 106d and 206d are provided to improve uniformity of polysilicon, and thus the following fabricating processes are improved. Furthermore, the second standard cell 200 can further include a plurality of gate connectors formed in between the second gate electrodes 206 for electrically connecting the second gate electrodes 206. It is noteworthy that the second gate electrodes 206 and the second gate connectors include a same material and are formed in a same layer. In the preferred embodiment, the first standard cell 100 includes no gate connectors, but not limited to this.

In accordance with the preferred embodiment, PMOS transistors are formed by the first gate electrodes 106 and the first doped regions 102a formed at its two sides, and NMOS transistors are formed by the first gate electrodes 106 and the second doped regions 104 at the two sides. In the same concept, PMOS transistors are formed by the second gate electrodes 206 and the third doped regions 202 at its two sides, and NMOS transistors are formed by the second gate electrodes 206 and the fourth doped regions 204 at its two sides. Compared with the first preferred embodiment in which the first doped regions 102 arranged at two respective sides of the symmetry axis A are spaced apart from each other by the symmetry axis A (and the first conductor 110), the first doped regions 102a at two respective sides of the symmetry axis A physically contact each other in the second preferred embodiments. Therefore, a length d1' of the first doped regions 102a is larger than a length d3 of the third doped region 204, and even larger than the length d1 of the first doped regions 102 provided by the first preferred embodiment. Consequently, the PMOS transistors obtain larger channel width and therefore higher speed and better driving capability.

Please refer to FIG. 6, which is a schematic drawing illustrating a modification to the second preferred embodiment. According to the modification, a length d2' of the second doped regions 104a is reduced. Therefore, the length d2' of the second doped region 104a provided by the modification is smaller than the length d4 of the fourth doped regions 204 in the first and second preferred embodiments. The space yielded by the second doped regions 104a is occupied by the lengthened first doped region 102a. Therefore a length d1" of the first doped regions 102a of the modification is even larger than the length d1' of the first doped regions 102a of the second preferred embodiment. Thus, the PMOS transistors obtains an even larger channel width and therefore higher speed and better driving capability.

It should be easily realized that the preferred embodiment and its modification also include the first conductor, the second conductors and the connecting layers. However, since the abovementioned elements are the same with those described in the first preferred embodiment, the details are omitted herein in the interest of brevity.

According to the second preferred embodiment and its modification, the integrated circuit layout structure 1 is constructed by the standard cells 100/200 of dual-height. The design complexity and the process complexity are both reduced, and space utilization is thus improved because the integrated circuit layout structure 1 includes the standard cells 100 of 2× height and the standard cells 200 of 1× height, only. Secondly, in the integrated circuit layout structure 1 provided by the present invention, the first standard cells 100 of 2× cell height serve as high-speed devices with high driving capability while the second standard cells 200 of 1× cell height comply with the requirements of low leakage and low power consumption. Eventually, the integrated circuit layout structure 1 provided by the present invention is able to concurrently comply with the integration requirements of high speed and low power consumption.

Furthermore, by adjusting the length of the first doped region 102a and the length of the second doped region 104a in the first standard cell 100, the PMOS transistors, which serve as the main arithmetic/logic units, obtain even larger channel width and higher speed, and thus electrical performance of the whole integrated circuit is further improved.

Figure 7:
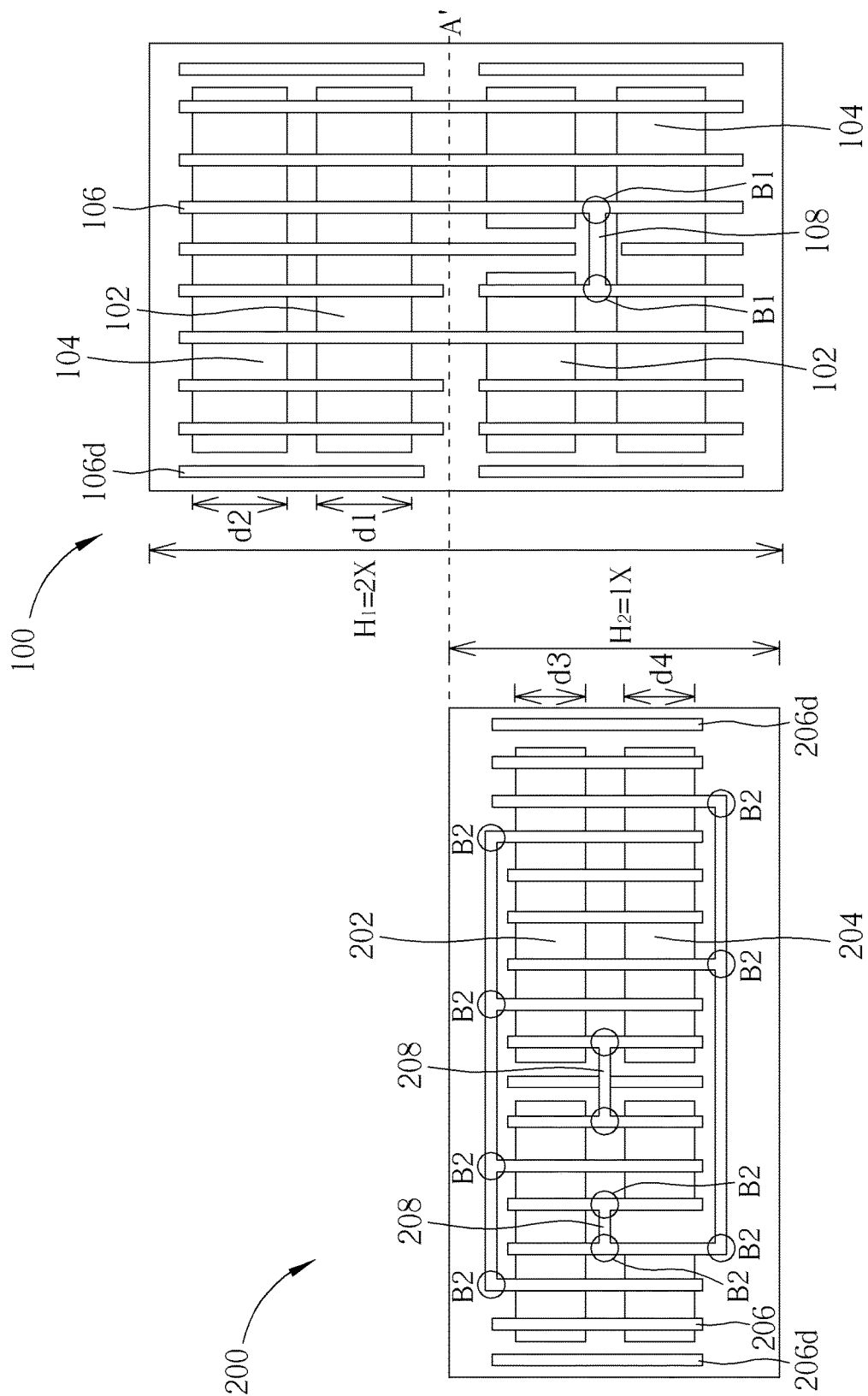
Figure 8:
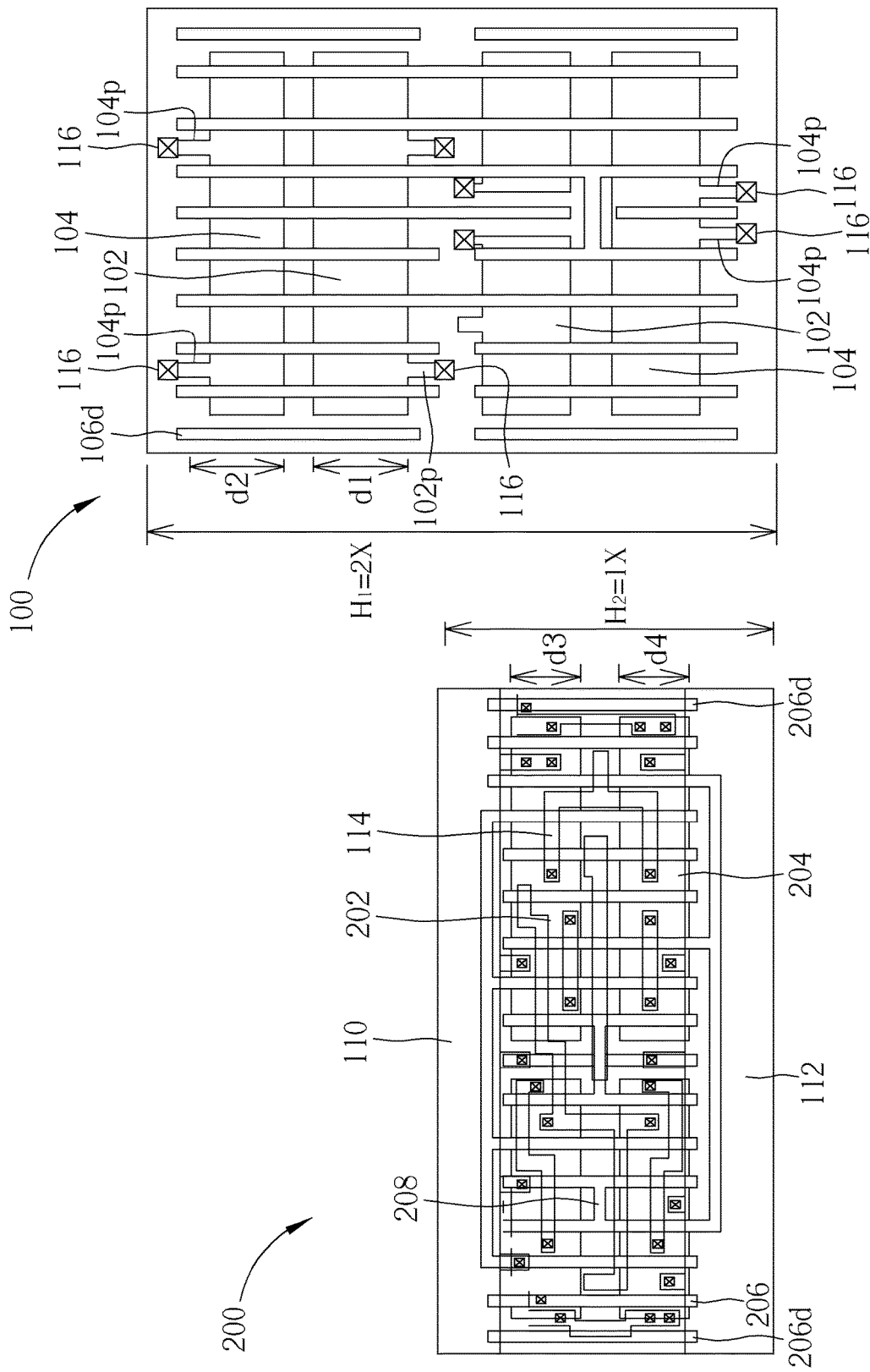
FIG. 8 is a schematic drawing illustrating a modification to the third preferred embodiment.

Please refer to FIGS. 1, 7 and 8, which are schematic drawings illustrating an integrated circuit layout structure provided by a third preferred embodiment. It should be noted that elements the same in the first and third preferred embodiments are designated by the same numerals. Please refer to FIG. 7 together with FIG. 1. An integrated circuit layout structure 1 provided by the preferred embodiment includes at least an APR block 10, and the APR block 10 includes a plurality of first standard cells 100 and a plurality of second standard cells 200. More important, the first standard cells 100 and the second standard cells 200 include different cell heights. Therefore, the integrated circuit layout structure 1 provided by the preferred embodiment is constructed by the dual-height standard cells 100/200. In the preferred embodiment, the first standard cell 100 and the second standard cell 200 can be cells having size larger than NOR2 cell, but not limited to this.

Please refer to FIG. 7 again. The first standard cells 100 respectively include a first cell height H1, the second standard cells 200 respectively include a second cell height H2, and the second cell height H2 is one half of the first cell height H1. In other words, the second cell height H2 of the second standard cells 200 is taken as 1× height while the first cell height H1 of the first standard cells 100 is taken as 2× height. Because different driving capabilities and speeds are required to even one kind of standard cells, 2× height standard cells for high driving capability and high speed are designed by the EDA while 1× height standard cells for lower leakage and low power consumption are designed by the EDA, and thus the first standard cells 100 of 2× height and the second standard cells 200 of 1× height are obtained. By arranging and placing the first standard cells 100 and the second standard cells 200 into the APR blocks 10, the APR blocks 10 of the integrated circuit layout structure 1 having dual-height cells are formed.

Please still refer to FIG. 7. The first standard cell 100 includes a plurality of first doped regions 102 and a plurality of second doped regions 104. The first doped regions 102 include a first conductivity type, the second doped regions 104 include a second conductivity type, and the first conductivity type and the second conductivity type are complementary to each other. The second standard cell 200 includes a plurality of third doped regions 202 and a plurality of fourth doped regions 204, the third doped regions 202 include the first conductivity type and the fourth doped regions 204 include the second conductivity type. In the preferred embodiment, the first conductivity type is a p type and the second conductivity type is an n type. However those skilled in the art should easily realize that it can be vice versa. As shown in FIG. 7, the first doped regions 102 are physically spaced apart from each other and arranged in a middle of the first standard cell 100. The second doped regions 104 are physically spaced apart from each other and arranged at a top side and a bottom side of the first standard cell 100. And the first doped regions 102 and the second doped regions 104 are physically spaced apart from each other. More important, the first doped regions 102 and the second doped regions 104 are mirror symmetric with respect to a symmetry axis A. And the first doped regions 102 at two sides of the symmetry axis A are physically spaced apart from each other. In the second standard cell 200, the third doped regions 202 are physically spaced apart from each other and arranged at a top side or a bottom side of the second standard cell 200 while the fourth doped regions 204 are physically spaced apart from each other and arranged at the alternatively side. The third doped regions 202 and fourth doped regions 204 are also spaced apart from each other. Furthermore, the first doped regions 102 and the third doped regions 202 include the same conductivity type (the p type), however a length d1 of the first doped regions 102 is larger than a length d3 of the third doped regions 202 in the preferred embodiment. The second doped regions 104 and the fourth doped regions 204 include the same conductivity type (the n type), and a length d2 of the second doped regions 104 is equal to a length d4 of the fourth doped regions 204, but not limited to this. It should be easily realized that the lengths of the first doped regions 102 and the second doped regions 104 can be adjusted as mentioned in the second preferred embodiment and its modification.

Please refer to FIG. 7 again. In the preferred embodiment, the first standard cell 100 further includes a plurality of first gate electrodes 106 and the second standard cell 200 further includes a plurality of second gate electrodes 206. Additionally, the first standard cell 100 can optionally include a plurality of dummy gates 106d and the second standard cell 200 can optionally include a plurality of dummy gates 206d. The dummy gates 106d and 206d are provided to improve uniformity of polysilicon, and thus the following fabricating processes are improved. It is noteworthy that the first standard cell 100 further includes at least a gate connector 108 formed in between the first gate electrodes 106 for electrically connecting those first gate electrodes 106 in the preferred embodiment. The second standard cell 200 can further include a plurality of gate connectors 208 formed in between the second gate electrodes 206 for electrically connecting the second gate electrodes 206. The gate connectors 108 and 208, the first gate electrodes 106 and the second gate electrodes 206 include a same material and are formed in the same layer. More important, an amount of the gate connector 108 in the first standard cell 100 is smaller than an amount of the gate connectors 208 in the second standard cell 200 according to the preferred embodiment.

Please still refer to FIG. 7. It is well-known to those skilled in the art that the polysilicon layouts including polysilicon patterns extended along one single direction provide better profile. However, such layouts are not able to accomplish a complete electrical construction when layout sizes are getting larger. Therefore gate connectors are placed to connect those polysilicon patterns (such as the gate electrodes) extended along the single direction. More important, when the gate connector contacts the gate electrode a "poly corner" is formed as emphasized by Circle B1 and B2 in FIG. 7. And those poly corners render adverse impact to the design for manufacturing (DFM). In the preferred embodiment, an amount of the poly corners B1 in the first standard cell 100 is smaller than an amount of the poly corner B2 in the second standard cell 200. It is therefore concluded that the integrated circuit layout structure 1 provided by the preferred embodiment advantages DFM.

Furthermore, defects such as corner rounding, line end shortening, and line end rounding are usually found in the polysilicon layers (that is the gate electrodes and the gate connectors) due to optical proximity effect and/or chemical treatments. Those defects deteriorate device performance, even cause process loss. As a countermeasure against to the problems, optical proximity correction (OPC) method is used to correct the image distortion at the polysilicon line ends. It is observed that the amount of the polysilicon line ends increases OPC loading. Please refer to FIG. 7. According to the preferred embodiment, the amount of the polysilicon line ends is reduced in the first standard cell 100. It is therefore concluded that the integrated circuit layout structure 1 provided by the preferred embodiment reduces the OPC loading.

Please refer to FIG. 8, which is a schematic drawing illustrating a modification to the third preferred embodiment. As mentioned above, the standard cell design layout also includes first metal layer layout, second metal layer layout and contact/via layouts, etc. The metal layer layouts are provided to connect the transistors while the contact/via layouts are provided to connect layouts in different layers. Furthermore, some contact/via layouts, on the other hands, are formed to be signal input/output terminals for the cells. Such contact/via layout serves as signal layout. In the preferred embodiment and its modification, a plurality of connecting layers 114 are formed in the first standard cell 100 and the second standard cell 200. As shown in FIG. 8, the connecting layers 114 are formed in the first standard cell 100 at where electrical connections are required. In the same concept, the connecting layers 114 are formed in the second standard cell 200 at where electrical connections are required.

More important, the second standard cell 200 includes a first conductor 110 and a second conductor 112 for providing Vdd and Vss, respectively. It is noteworthy that the first standard cell 100 can include a first conductor 110 extending across its middle and a pair of second conductors 112 extending across the its top and its bottom as detailed in the first preferred embodiment. Or, the first standard cell 100 can be different from the abovementioned preferred embodiments: The first standard cell 100 in the modification includes a plurality of protrusions 102p in the first doped regions 102 and a plurality of protrusion 104p in the second doped regions 104. The protrusions 102p/104p are electrically connected to contact plugs and the contact plugs are electrically connected to Vdd or Vss. That is, grid power terminals 116 for providing Vdd or Vss are rendered by the preferred embodiment.

According to the modification, the first conductors and the second conductors, which are power strips, in the aforementioned embodiments are replaced with grid power terminals 116. And those grid power terminals 116 can be electrically connected by routing procedure.

According to the third preferred embodiment and its modification, the integrated circuit layout structure 1 is more suitable in large-sized circuit layout structure while the first standard cells 100 show superior DFM. Furthermore, the first conductors and the second conductors, which are power strips, can be replaced with the grid power terminals 116 and the grid power terminals 116 can be electrically connected to obtain Vdd and Vss by routing procedures which have already been a highly automatic procedure in the contemporary semiconductor industry. Therefore, the flexibility of layout designing is improved without increasing process complexity.

Figure 9A:
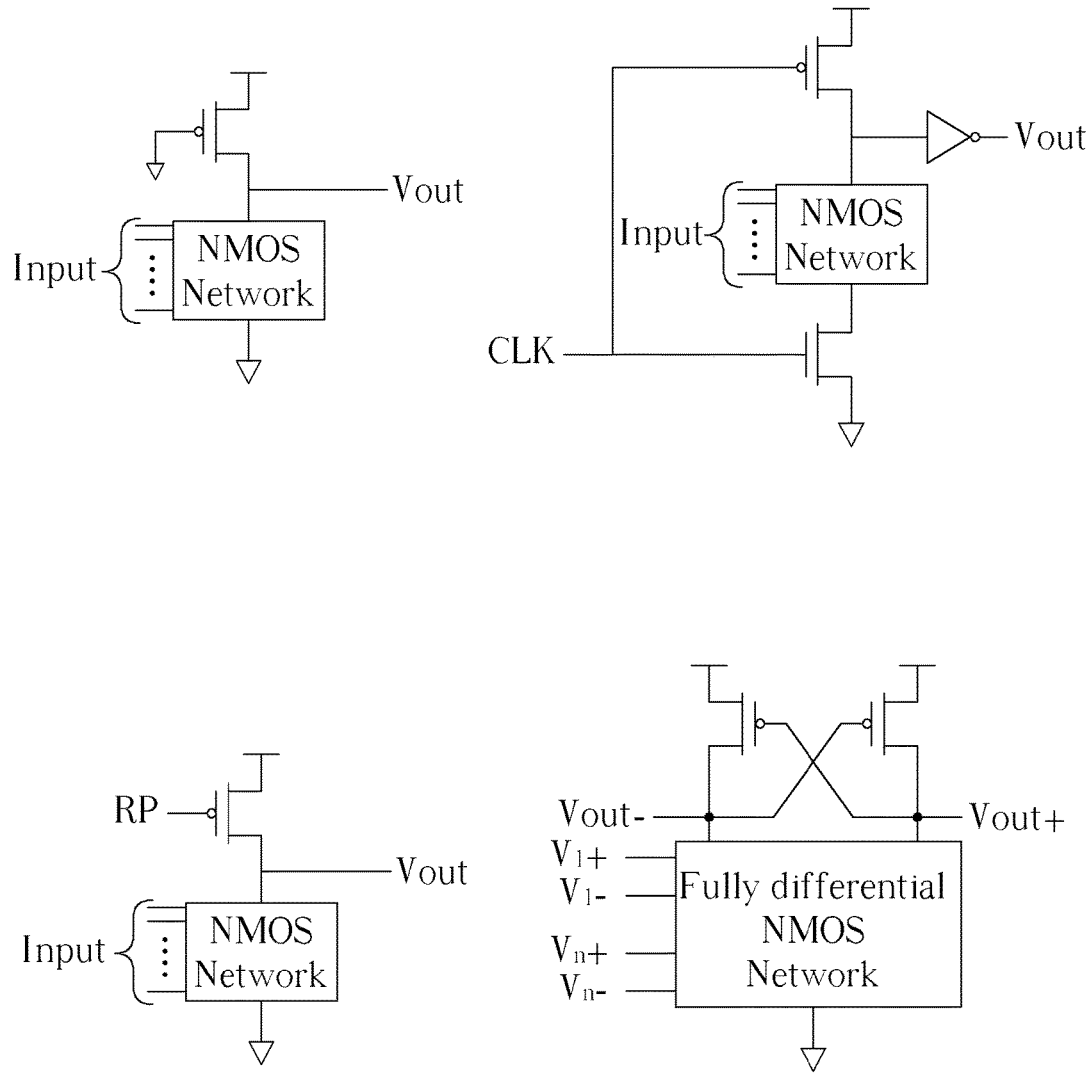
FIGS. 9A and 9B are circuit diagrams provided by a fourth preferred embodiment of the present invention.
Figure 9B:
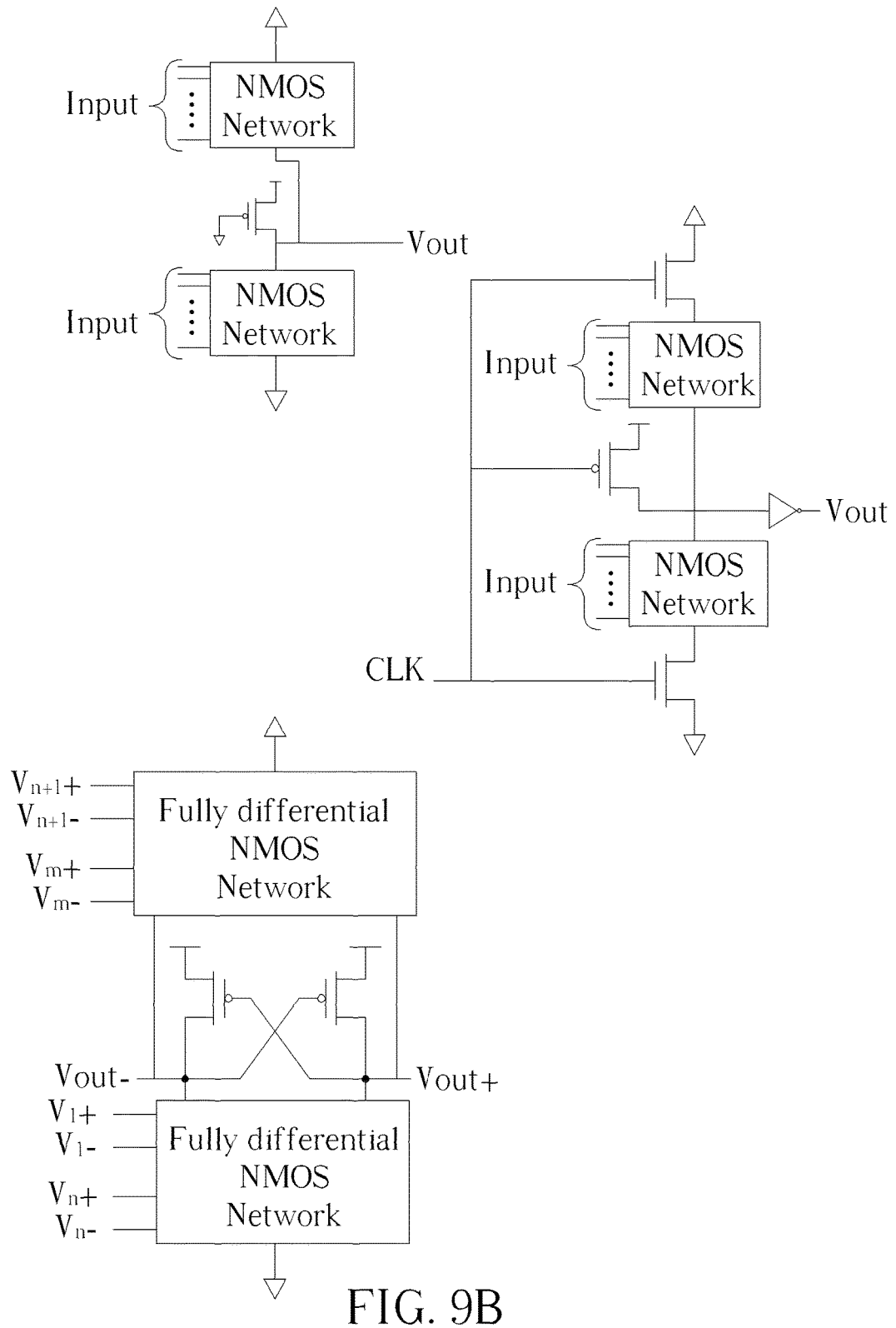
Figure 10:
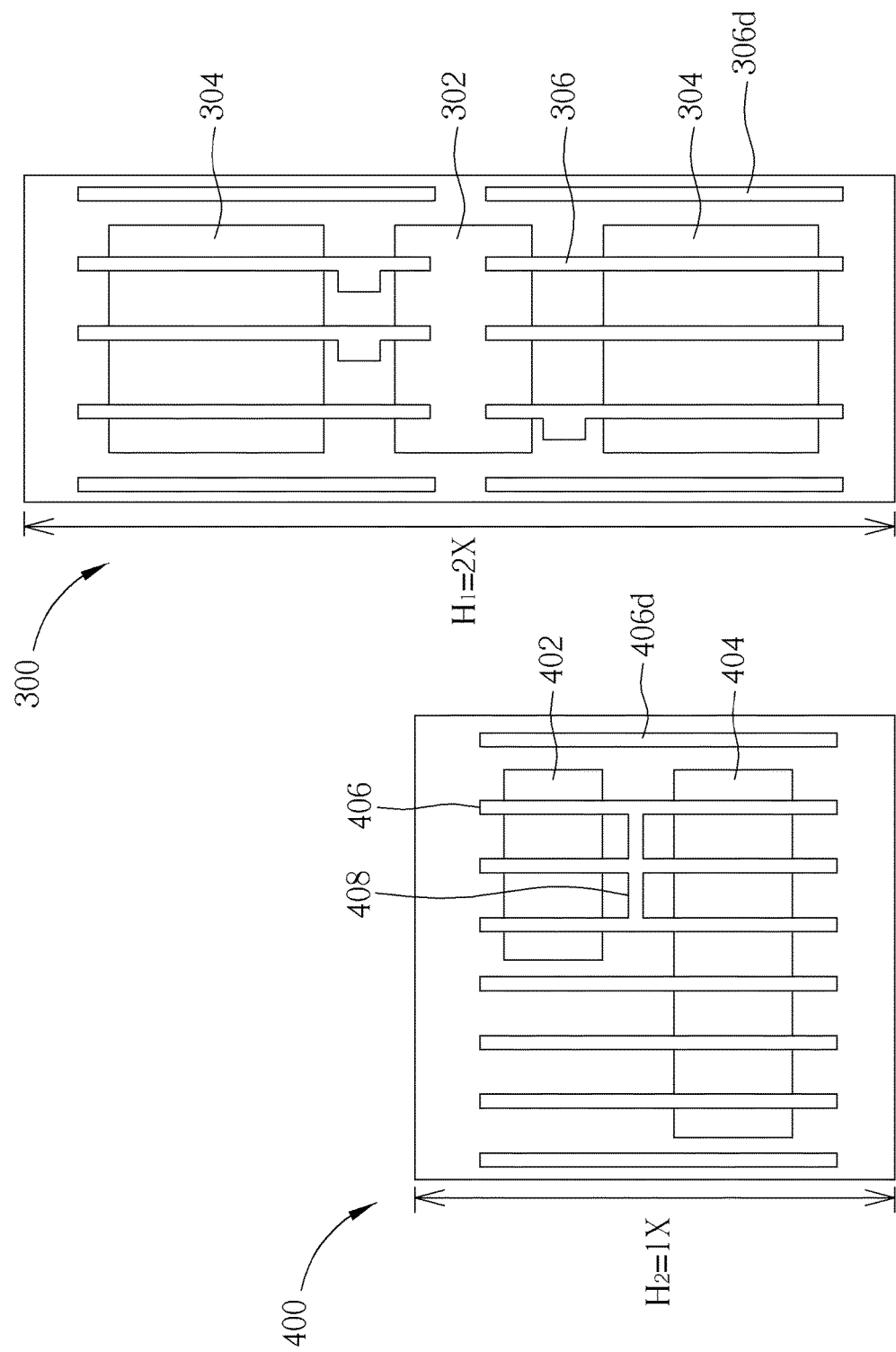
Figure 11:
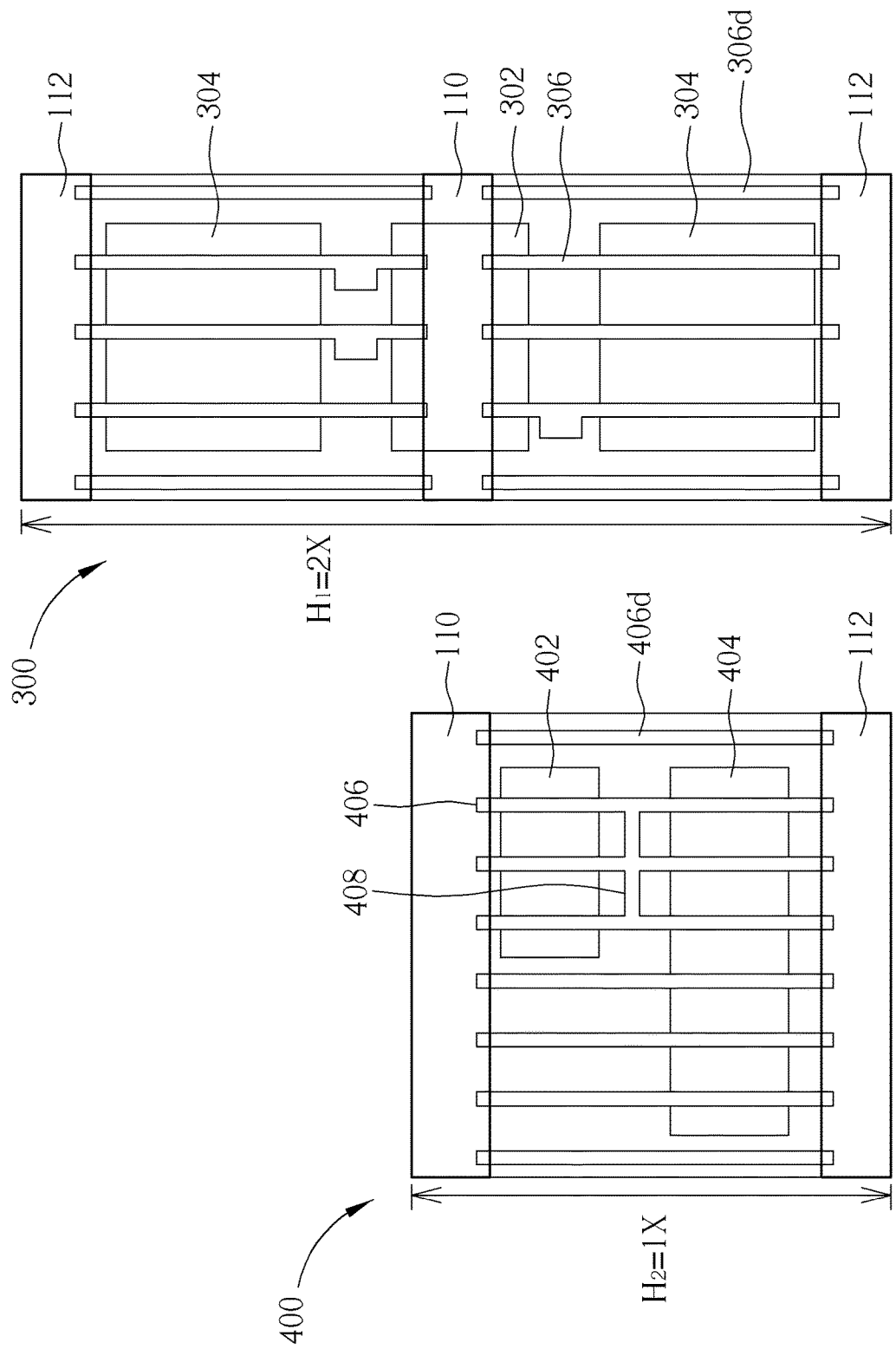

Please refer to FIGS. 1, 4 and 9A-11. FIGS. 9A and 9B are circuit diagrams provided by a fourth preferred embodiment of the present invention and FIGS. 10-11 are schematic drawings illustrating an integrated circuit layout structure provided by the fourth preferred embodiment. Please refer to FIG. 1 first. As mentioned above, an integrated circuit layout structure 1 provided by the preferred embodiment includes at least an APR block 10, and the APR block 10 includes a plurality of first standard cells 300 and a plurality of second standard cells 400. More important, the first standard cells 300 and the second standard cells 400 include different cell heights. Therefore, the integrated circuit layout structure 1 provided by the preferred embodiment is constructed by the dual-height standard cells 300/400. It should be noted that in the aforementioned embodiments, CMOS device which includes NMOS transistors and PMOS transistors is provided. Different from those aforementioned embodiments, the main arithmetic/logic units in the first standard cells 300 are the NMOS transistors while the PMOS transistors serve as the pull-up network (PUN) in the preferred embodiment. As shown in FIG. 9, the first standard cells 300 include pseudo n-channel metal-oxide-semiconductor (pseudo-NMOS) logic cell, dynamic logic cell, domino logic cell, or fully differential logic cell. Additionally, the second standard cell 400 can also include the pseudo-NMOS logic cell, the dynamic logic cell, the domino logic cell, or the fully differential logic cell, but not limited to this.

Please refer to FIG. 10 together with FIG. 1. The first standard cells 300 respectively include a first cell height H1, the second standard cells 400 respectively include a second cell height H2, and the second cell height H2 is one half of the first cell height H1. In other words, the second cell height H2 of the second standard cells 400 is taken as 1× height while the first cell height H1 of the first standard cells 300 is taken as 2× height. Because different driving capabilities and speeds are required to even one kind of standard cells, 2× height standard cells for high driving capability and high speed are designed by the EDA while 1× height standard cells for lower leakage and low power consumption are designed by the EDA, and thus the first standard cells 300 of 2× height and the second standard cells 400 of 1× height are obtained. By arranging and placing the first standard cells 300 and the second standard cells 400 into the APR blocks 10, the APR blocks 10 of the integrated circuit layout structure 1 having dual-height cells are formed.

Please refer to FIG. 10 again. As mentioned above, it is well-known to those skilled in the art that each standard cell layout may include active region layout (such as layout for wells or for doped regions) and polysilicon or semiconductor design layouts. The active region layout and the polysilicon layout construct MOS transistors (such as the sources/drains and the gates). In the preferred embodiment, the first standard cell 300 includes at least one or more first doped region 302 and a plurality of second doped regions 304. The first doped region 302 includes a first conductivity type, the second doped regions 304 include a second conductivity type, and the first conductivity type and the second conductivity type are complementary to each other. The second standard cell 400 includes a plurality of third doped regions 402 and a plurality of fourth doped regions 404, the third doped regions 242 include the first conductivity type and the fourth doped regions 404 include the second conductivity type. In the preferred embodiment, the first conductivity type is a p type and the second conductivity type is an n type. However those skilled in the art should easily realize that it can be vice versa. As shown in FIG. 10, the first doped region 302 is arranged in a middle of the first standard cell 300. The second doped regions 304 are physically spaced apart from each other and arranged at a top side and a bottom side of the first standard cell 300. And the first doped region 302 and the second doped regions 304 are physically spaced apart from each other. In the second standard cell 400, the third doped regions 402 are physically spaced apart from each other and arranged at a top side or a bottom side of the second standard cell 400 while the fourth doped regions 404 are physically spaced apart from each other and arranged at the alternatively side. The third doped regions 402 and fourth doped regions 404 are also spaced apart from each other.

Please still refer to FIG. 10. In the preferred embodiment, the first standard cell 300 further includes a plurality of first gate electrodes 306 and the second standard cell 400 further includes a plurality of second gate electrodes 406. Additionally, the first standard cell 300 can optionally include a plurality of dummy gates 306d and the second standard cell 400 can optionally include a plurality of dummy gates 406d. The dummy gates 306d and 406d are provided to improve uniformity of polysilicon, and thus the following fabricating processes are improved. Furthermore, the second standard cell 400 can further include a plurality of gate connectors 408 formed in between the second gate electrodes 406 for electrically connecting the second gate electrodes 406. The gate connectors 408 and the second gate electrodes 406 include a same material and are formed in a same layer.

A PMOS transistor is formed by the first gate electrodes 306 and the first doped regions 302 formed at its two sides, and NMOS transistors are formed by the first gate electrodes 306 and the second doped regions 304 at its two sides. In the same concept, PMOS transistors are formed by the second gate electrodes 406 and the third doped regions 402 at its two sides, and NMOS transistors are formed by the second gate electrodes 406 and the fourth doped regions 404 at its two sides. In the first standard cell 300, only one PMOS transistor is required to be the pull-up network. Therefore lengths of the first doped region 302 can be reduced and space yielded by the first doped regions 302 is occupied by the lengthened second doped regions 304. Therefore, an area of the first doped regions 302 is smaller than an area of the second doped regions 304. Consequently, more or larger NMOS transistors can be accommodated. Specifically, the first standard cell 300 includes at least one or more PMOS transistor and a plurality of NMOS transistors, and the second standard cell 400 includes at least one or more PMOS transistor and a plurality of NMOS transistors. An amount of the PMOS transistor in the first standard cell 300 is equal to an amount of the PMOS transistor in the second standard cell 400. In the preferred embodiment, both of the first standard cell 300 and the second standard cell 400 include one PMOS transistor. It is concluded that the first standard cell 300 and the second standard cell 400 include identical driving capability. However, a logic operation maximum of the first standard cell 300 is larger than the second standard cell 400. For example, the logic operation maximum of the first standard cell 300 is two times of the second standard cell 400, but not limited to this.

Please refer to FIG. 11. As mentioned above, it is also well-known to those skilled in the art that the standard cell design layout includes not only the active region design layout and the polysilicon design layout, but also first metal layer layout, second metal layer layout and contact/via layouts, etc. The metal layer layouts are provided to connect the transistors while the contact/via layouts are provided to connect layouts in different layers. Additionally, some contact/via can be formed to be signal input/output terminals for the cells. Such contact/via layout serves as signal layout. Accordingly, the preferred embodiment further provides at least a first conductor 110, a pair of second conductors 112, and a plurality of connecting layers (not shown). The connecting layers are formed at where electrical connection is required in the first standard cell 300 and the second standard cell 400. The first conductor 110 extends across the middle of the first standard cell 300.

Please refer to FIG. 11 together with FIG. 4. Spatial relationships between the first conductors 110, the second conductors 112, the first standard cells 300 and the second standard cells 400 in the preferred embodiment can be the same with those described in the first preferred embodiment, and therefore FIG. 4 is preferably referred together with FIG. 11. As mentioned above, each standard cell must be connected to appropriate DC power to obtain power supply voltage Vdd. Also, each standard cell must obtain a ground voltage Vss. Therefore, Vdd power strips and Vss power strips must be alternately arranged in one APR block 10 as shown in FIG. 4, so that the standard cells arranged in the APR block 10 can obtain Vdd and Vss. In the preferred embodiment, the first conductors 110 can be the Vdd strip and thus the second conductors 112 are the Vss strip in that case. On the contrary, when the first conductors 110 are the Vss strips, the second conductors 112 are the Vdd strips. In each first standard cell 300, as shown in FIGS. 4 and 10, the first conductor 110 extends across the middle of the first standard cell 300 and a middle of the first doped region 402, and the second conductors 112 extend across a top and a bottom of the first standard cell 300. In each second standard cell 400, as shown in FIG. 4, one of the second conductors 112 extends across a top or a bottom of the second standard cell 400, and the first conductor 110 extends across the top or the bottom of the second standard cell 400 opposite to the second conductor 112. Accordingly, not only the integration of 1× height standard cells and 2× height standard cells are simplified, but also the power supply layout designing is simplified according to the integrated circuit layout structure 1 provided by the preferred embodiment. And thus design complexity and process complexity are reduced.

According to the integrated circuit layout structure 1 provided by the present invention, design complexity and process complexity are both reduced, and space utilization is thus improved because the integrated circuit layout structure 1 includes the standard cells 300 of 2× height and the standard cells 400 of 1× height, only. Secondly, the integrated circuit layout structure 1 provided by the present invention can be adopted not only in CMOS device, but also in pseudo-NMOS logic cell, dynamic logic cell, domino logic cell, or fully differential logic cell. It is concluded that the integrated circuit layout structure 1 provided by the present invention improves semiconductor integration. Furthermore, since standard cells 300/400 of different cell heights are provided to comply with different requirements, eventually the integrated circuit layout structure 1 provided by the present invention is able to concurrently comply with the integration requirements of high speed and low power consumption.

Briefly speaking, according to the integrated circuit layout structure having the dual-height standard cells provided by the present invention, the second cell height of the second standard cell is one half of the first cell height of the first standard cell and thus the integrated circuit layout structure is taken as to be constructed by standard cells of 1× cell height and another standard cells of 2× cell height. Accordingly, both the integrated circuit layout design and manufacturing processes are simplified and the space utilization efficiency is improved because there are only two kinds of standard cells. More important, the integrated circuit layout structure having the dual-height standard cells complies with different requirements: The standard cells of 2× cell height serve as high-speed devices with high driving capability while the standard cells of 1× cell height comply with the requirements of low leakage and low power consumption. Eventually, the integrated circuit layout structure having the dual-height standard cells provided by the present invention is able to concurrently comply with the integration requirements of high speed and low power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit layout structure having dual-height standard cells, comprising:
    at least a first standard cell having a first cell height, the first standard cell comprising one first doped region formed in a middle of the first standard cell and a plurality of second doped regions formed at a top side and a bottom side of the first standard cell, the first doped region having a first conductivity type, the second doped regions having a second conductivity type, and the first conductivity type and the second conductivity type are complementary to each other, wherein a total area of the first doped region in the middle of the first standard cell is smaller than a total area of the second doped regions at the top side of the first standard cell and is smaller than a total area of the second doped regions at the bottom side of the first standard cell; and
    at least a second standard cell having a second cell height, the second cell height being one half of the first cell height.

2. The integrated circuit layout structure having the dual-height standard cells according to claim 1, wherein the second standard cell further comprises at least one or more third doped region comprising the first conductivity type and at least one or more fourth doped region comprising the second conductivity type.

3. The integrated circuit layout structure having the dual-height standard cells according to claim 1, further comprising a first conductor extending across the middle of the first standard cell and a middle of the first doped region.

4. The integrated circuit layout structure having the dual-height standard cells according to claim 3, further comprising a pair of second conductors respectively extending across a top and a bottom of the first standard cell, and one of the second conductors extending across a top or a bottom of the second standard cell.

5. The integrated circuit layout structure having the dual-height standard cells according to claim 4, wherein the first conductor extends across the top or the bottom of the second standard cell opposite to the second conductor.

6. The integrated circuit layout structure having the dual-height standard cells according to claim 1, wherein the first standard cell comprises pseudo n-channel metal-oxide-semiconductor (pseudo-NMOS) logic cell, or dynamic logic cell, or domino logic cell, or fully differential logic cell.

7. The integrated circuit layout structure having the dual-height standard cells according to claim 6, wherein the first doped region comprises a PMOS transistor for Pull-up, and the second doped regions comprise NMOS Network for Logic operation.

8. An integrated circuit layout structure having dual-height standard cells, comprising:
    at least a first standard cell having a first cell height, the first standard cell comprising one first doped region and a plurality of second doped regions, the first doped region having a first conductivity type, the second doped regions having a second conductivity type, and the first conductivity type and the second conductivity type are complementary to each other, wherein a total area of the first doped region in a middle of the first standard cell is smaller than a total area of the second doped regions at a top side of the first standard cell and is smaller than a total area of the second doped regions at a bottom side of the first standard cell;
    at least a second standard cell having a second cell height, the second cell height being one half of the first cell height; and
    a first conductor extending across a middle of the first standard cell.

9. The integrated circuit layout structure having the dual-height standard cells according to claim 8, wherein the second standard cell further comprises at least one or more third doped region comprising the first conductivity type and at least one or more fourth doped region comprising the second conductivity type.

10. The integrated circuit layout structure having the dual-height standard cells according to claim 8, wherein the first standard cell further comprises a plurality of first gate electrodes and the second standard cell further comprises a plurality of second gate electrodes.

11. The integrated circuit layout structure having the dual-height standard cells according to claim 10, further comprising a plurality of gate connectors formed in between and electrically connecting the second gate electrodes, the second gate electrodes and the gate connectors comprise a same material formed in a same layer.

12. The integrated circuit layout structure having the dual-height standard cells according to claim 11, wherein the first standard cell comprises no gate connector.

13. The integrated circuit layout structure having the dual-height standard cells according to claim 8, further comprising a pair of second conductors extending across a top and a bottom of the first standard cell.

14. The integrated circuit layout structure having the dual-height standard cells according to claim 13, wherein one of the second conductors extends across a top or a bottom of the second standard cell.

15. The integrated circuit layout structure having the dual-height standard cells according to claim 14, wherein the first conductor extends across the top or the bottom of the second standard cell opposite to the second conductor.

16. The integrated circuit layout structure having the dual-height standard cells according to claim 8, wherein the first standard cell comprises pseudo n-channel metal-oxide-semiconductor (pseudo-NMOS) logic cell, or dynamic logic cell, or domino logic cell, or fully differential logic cell.

17. The integrated circuit layout structure having the dual-height standard cells according to claim 16, wherein the first doped region comprises a PMOS transistor for Pull-up, and the second doped regions comprise NMOS Network for Logic operation.

* * * * *